(12) United States Patent
Li et al.

(10) Patent No.: US 10,719,156 B2
(45) Date of Patent: Jul. 21, 2020

(54) TOUCH DISPLAY PANEL, MANUFACTURING METHOD THEREOF AND TOUCH DISPLAY DEVICE

(71) Applicants: Kunshan New Flat Panel Display Technology Center Co., Ltd., Kunshan, Jiangsu (CN); KunShan Go-Visionox Opto-Electronics Co., Ltd, Kunshan, Jiangsu (CN)

(72) Inventors: Weiguo Li, Jiangsu (CN); Hui Zhu, Jiangsu (CN); Xiaobao Zhang, Jiangsu (CN)

(73) Assignees: KUNSHAN NEW FLAT PANEL DISPLAY TECHNOLOGY CENTER CO., LTD., Kunshan, Jiangsu (CN); KUNSHAN GO-VISIONOX OPTO-ELECTRONICS CO., LTD, Kunshan, Jiangsu (CN)

( * ) Notice: Subject to any disclaimer, the term of this patent is extended or adjusted under 35 U.S.C. 154(b) by 0 days.

(21) Appl. No.: 16/319,724

(22) PCT Filed: Jan. 23, 2018

(86) PCT No.: PCT/CN2018/073700
§ 371 (c)(1),
(2) Date: Jan. 22, 2019

(87) PCT Pub. No.: WO2018/137589
PCT Pub. Date: Aug. 2, 2018

(65) Prior Publication Data
US 2020/0125202 A1    Apr. 23, 2020

(30) Foreign Application Priority Data

Jan. 25, 2017  (CN) .......................... 2017 1 0060968
Nov. 30, 2017  (CN) .......................... 2017 1 1244625

(51) Int. Cl.
*G06F 3/041*    (2006.01)
*G06F 3/044*    (2006.01)
(Continued)

(52) U.S. Cl.
CPC .......... *G06F 3/0412* (2013.01); *G06F 3/0446* (2019.05); *H01L 27/323* (2013.01);
(Continued)

(58) Field of Classification Search
CPC ................. G06F 3/0412; G06F 3/0446; G06F 2203/04103; G06F 2203/04112; H01L 27/323; H01L 51/5237; H01L 51/56
See application file for complete search history.

(56) References Cited

U.S. PATENT DOCUMENTS

2010/0265206 A1   10/2010  Chen
2014/0055403 A1 *   2/2014  Cok .................... G06F 3/044
                                              345/174
(Continued)

FOREIGN PATENT DOCUMENTS

CN    101458584 A    6/2009
CN    102738199 A   10/2012
(Continued)

OTHER PUBLICATIONS

Office Action issued in Chinese Patent Application No. 201880000466.8, dated Jun. 11, 2019.

*Primary Examiner* — Charles V Hicks
(74) *Attorney, Agent, or Firm* — Baker & Hostetler LLP

(57) ABSTRACT

The present disclosure relates to the field of touch technology, and in particular, to a touch display panel and a manufacturing method thereof, and a touch display device, which is used to solve the problem that the touch structure existing in the prior art cannot meet the usage requirements due to inability to combine flexibility with light transmittance. The touch display panel includes: a substrate, a thin film encapsulation layer, an OLED element layer, and a touch structure; the OLED element layer includes a plurality of light-emitting devices arranged in an array manner, projections of the touch structure and the light-emitting
(Continued)

device of the OLED element layer are not overlapped with each other along a direction from the substrate to the thin film encapsulation layer, thereby avoiding the influence of the touch structure on the display effect by staggering the positions of the touch structure and the light-emitting devices, and selecting materials with better flexibility to manufacture the touch structure to meet the usage requirements for a flexible touch display panel.

14 Claims, 11 Drawing Sheets

(51) Int. Cl.
    *H01L 27/32*     (2006.01)
    *H01L 51/52*     (2006.01)
    *H01L 51/56*     (2006.01)

(52) U.S. Cl.
    CPC .......... *H01L 51/5237* (2013.01); *H01L 51/56* (2013.01); *G06F 2203/04103* (2013.01); *G06F 2203/04112* (2013.01)

(56) References Cited

U.S. PATENT DOCUMENTS

| | | |
|---|---|---|
| 2015/0317020 A1 | 11/2015 | Watanabe et al. |
| 2016/0041667 A1 | 2/2016 | Lai et al. |
| 2016/0109977 A1 | 4/2016 | Hashimoto et al. |
| 2016/0179229 A1* | 6/2016 | Ahn ................ G06F 3/041 345/173 |
| 2016/0349558 A1 | 12/2016 | Shishido et al. |

FOREIGN PATENT DOCUMENTS

| | | |
|---|---|---|
| CN | 103748538 A | 4/2014 |
| CN | 104409467 A | 3/2015 |
| CN | 105334994 A | 2/2016 |
| CN | 105607356 A | 5/2016 |
| CN | 205282479 U | 6/2016 |
| CN | 106293197 A | 1/2017 |
| CN | 106293216 A | 1/2017 |
| CN | 106293298 A | 1/2017 |
| CN | 107219955 A | 9/2017 |
| EP | 3012714 A1 | 4/2016 |
| EP | 3109742 A1 | 12/2016 |

* cited by examiner

TOUCH DISPLAY PANEL, MANUFACTURING METHOD THEREOF AND TOUCH DISPLAY DEVICE

CROSS-REFERENCE TO RELATED APPLICATIONS

This application is a National Stage of International patent application PCT/CN2018/073700, filed on Jan. 23, 2018, which claims priority to foreign Chinese patent application No. CN 201710060968.7, filed on Jan. 25, 2017, and Chinese patent application No. CN 201711244625.2, filed Nov. 30, 2017, the disclosures of which are incorporated by reference in their entireties.

TECHNICAL FIELD

The disclosure relates to the field of touch technology, and in particular to a touch display panel, a method for manufacturing the same, and a touch display device.

BACKGROUND

With the development of touch technology and display technology, a touch display device has been increasingly sought after by people, which not only saves space and is convenient to carry, but also enables a comfortable and very convenient experience through directly operating by a user with a finger or stylus etc. At present, various technical fields have been widely applied, such as personal digital processing (PDA), touch type mobile phones, portable notebook computers and the like which are commonly used in the market.

Active Matrix Organic Lighting Emitting Display (AMOLED) is an emerging flat panel display, which is named as a new generation display that can replace the liquid crystal display (LCD), for its advantages such as active illumination, high contrast, fast response, thinness and so on. At present, the combination of touch technology and AMOLED display technology has attracted people's attention. It is foreseeable that touch type AMOLED displays will become the mainstream in the market.

Generally, touch display panels can be classified into three types according to a composition structure: an Add-On type, an On-Cell type, and an In-Cell type. The display panel and the touch screen of the Add-On type touch display panel are separately fabricated and assembled, and the touch screen is attached to the outer surface of the display panel. The touch-control electrodes of the On-Cell-type touch display panel are disposed on the display panel, and the touch-control electrodes of the In-Cell-type touch display panel are disposed inside the display panel. The On-Cell type and the In-Cell type can realize the integration of the touch panel and the display panel, making the display device thinner and lighter.

Please see FIG. 1, FIG. 1 is a structural schematic view of an On-Cell type touch display panel in the related art. As shown in FIG. 1, the On-Cell type touch display panel 100 generally comprises a first substrate 110 and a second substrate 120 disposed opposite to each other, an OLED element layer 130 disposed between the first substrate 110 and the second substrate 120, and a touch layer 140 disposed on the second substrate 120.

However, the touch structure of the presented On-Cell type touch display panel cannot meet the usage requirements due to inability to combine flexibility with light transmittance, which has become an urgent technical problem to be solved by a person skilled in the art.

SUMMARY

Embodiments of the disclosure provide a touch display panel, a manufacturing method thereof, and a touch display device, which are used to solve the problem that the touch structure existing in the prior art cannot meet the usage requirements due to inability to combine flexibility with light transmittance.

In order to solve the above technical problem, embodiments of the disclosure adopt the following technical solutions:

a touch display panel is provided, comprising: a substrate, a thin film encapsulation layer, an OLED element layer, and a touch structure; the substrate being disposed oppositely to the thin film encapsulation layer, the OLED element layer being disposed between the substrate and the thin film encapsulation layer, and the touch structure being disposed on a side of the thin film encapsulation layer away from the substrate; the OLED element layer comprising a plurality of light-emitting devices arranged in an array manner, and an orthographic projection of the touch structure along a direction extending from the substrate to the thin film encapsulation layer being not overlapped with an orthographic projection of the light-emitting device of the OLED element layer along the direction extending from the substrate to the thin film encapsulation layer.

Optionally, the touch structure comprises: a first touch structure and a second touch structure, wherein the first touch structure and the second touch structure are insulative.

Optionally, the first touch structure comprises a plurality of first touch electrodes disposed along a first direction; and the second touch structure comprises a plurality of second touch electrodes disposed along a second direction, and the first touch electrode is disposed crosswise to the second touch electrode.

Optionally, the first touch electrode is a first metal layer, the second touch electrode is a second metal layer, and an insulative layer is disposed between the first metal layer and the second metal layer.

Optionally, the first touch electrode has a plurality of first electrode elements disposed along the second direction, the second touch electrodes each has a plurality of second electrode elements disposed along the first direction; a spacing between the first electrode units electrode elements on two adjacent first touch electrodes is equal to a spacing between the second electrode elements on two adjacent second touch electrodes; a spacing between the first electrode element and its adjacent second touch electrode is equal to a spacing between the second electrode element and its adjacent first touch electrode.

Optionally, the first touch structure is a first metal grid layer, the second touch structure is a second metal grid layer, and an insulative layer is sandwiched between the first metal grid layer and the second metal grid layer.

Optionally, the first metal grid layer is staggered from the second metal grid layer.

Optionally, as for a gap corresponding to any one of adjacent light-emitting devices, a distance between a center of the gap and two outermost sides of the touch structure is not greater than a preset threshold; wherein, a difference value is obtained by subtracting the preset threshold from a sum of ½ length value of the light-emitting device and the gap spacing value, and a ratio of the difference value to a thickness value of the thin film encapsulation layer is a tangent value of a viewing angle of the touch display panel.

Optionally, a film layer thickness value of a touch wiring in the touch structure is negatively correlated with a width value of the touch wiring.

Optionally, a wire width of the touch wiring in the touch structure meets the following equation:

$$L \leq 2*l-\alpha = 2*[K/2-(N*\tan\theta-M)]-\alpha \quad (1)$$

wherein, L is the wire width of the touch wiring, l is a ½ wire width of the touch wiring, α is an engineering capability error, K is a gap spacing corresponding to the adjacent light-emitting devices, M is a ½ length of the light-emitting device, N is the thickness of the thin film encapsulation layer, and θ is a viewing angle of the touch display panel.

Optionally, a wire width of the touch wiring in the touch structure meets the following equation:

$$L = 2^* l - \alpha = 2^*[K/2 - (N^*\tan(90° - \theta_1) - M)] - \alpha \quad (2)$$

$$\frac{\sin\theta}{\sin\theta_1} = n \quad (3)$$

wherein, L is the wire width of the touch wiring, l is a ½ wire width of the touch wiring, α is an engineering capability error, K is a gap spacing corresponding to the adjacent light-emitting devices, M is a ½ length of the light-emitting device, N is the thickness of the thin film encapsulation layer, θ is a viewing angle of the touch display panel, $\theta_1$ is a refraction angle of the viewing angle after entering the film encapsulation layer, and n is a refractive index of the film encapsulation layer.

Optionally, an electrically conductive material in the touch structure is at least one or more combinations of molybdenum aluminum molybdenum, titanium aluminum titanium, and silver; a material for the insulative layer is at least one or more combinations of silicon oxide, silicon nitride, and silicon oxynitride.

A touch display device is provided, comprising the above touch display panel.

A method of manufacturing a touch display panel is provided, comprising: providing a substrate; forming an OLED element layer on the substrate; forming a thin film encapsulation layer on the OLED element layer; and forming a touch structure on the thin film encapsulation layer; wherein, the OLED element layer comprises a plurality of light-emitting devices arranged in an array manner, and an orthographic projection of the touch structure along a direction extending from the substrate to the thin film encapsulation layer is not overlapped with an orthographic projection of the light-emitting device of the OLED element layer along the direction from the substrate to the thin film encapsulation layer.

The above at least one technical solution adopted by embodiments of the disclosure can achieve the following beneficial effects:

In the touch display panel, the manufacturing method thereof and the touch display device provided by the disclosure, the influence of the touch structure on the display effect is avoided by staggering the positions of the touch structure and the light-emitting devices, thereby selecting materials with better flexibility to manufacture the touch structure to meet the usage requirements for a flexible touch display panel.

BRIEF DESCRIPTION OF THE DRAWINGS

The drawings described herein are provided for further understanding of the disclosure and constitutes a part of the disclosure. The exemplary embodiments of the disclosure and description thereof are used to explain the disclosure and are not taken as any improper limitation to the disclosure. In the drawings.

DETAILED DESCRIPTION

In order to make the purposes, technical solutions and advantages of the disclosure clearer, the technical solutions of the disclosure will be described below clearly and completely with reference to the specific embodiments and the corresponding drawings. It is apparent that the described embodiments are merely part of the embodiments of the disclosure rather than all the embodiments. Based on the embodiments in the disclosure, all the other embodiments obtained by a person skilled in the art without paying creative work will fall into the protection scope of the disclosure.

The technical solutions provided by the embodiments of the disclosure are described below in detail with reference to the accompanying drawings.

Figure 1:
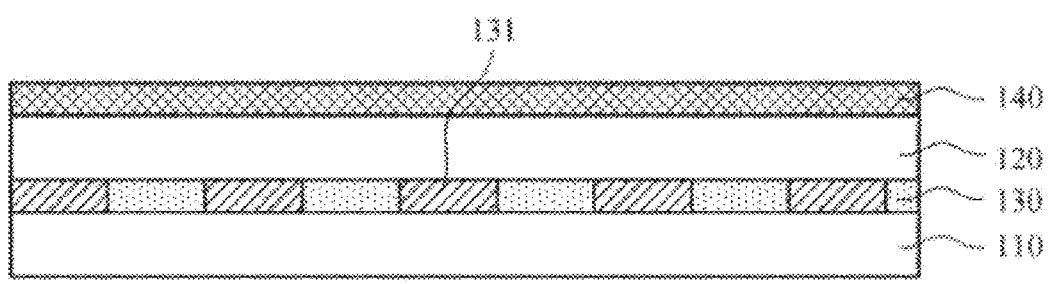
FIG. 1 is a structural schematic view of On-Cell type touch display panel in the prior art.
Figure 2:
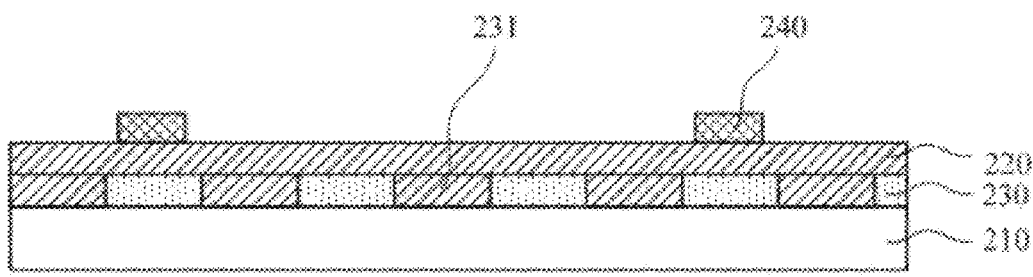
FIG. 2 is a structural schematic view of a touch display panel according to an embodiment of the disclosure.

With reference to FIG. 2, FIG. 2 is a structural schematic view of a touch display panel according to an embodiment of the disclosure. The touch display panel comprises a substrate 210, a thin film encapsulation layer (TFE) 220, an OLED element layer 230, and a touch structure 240; the substrate 210 is disposed oppositely to the thin film encapsulation layer 220, the OLED element layer 230 is disposed between the substrate 210 and the thin film encapsulation layer 220, and the touch structure 240 is disposed on a side of the thin film encapsulation layer 220 away from the substrate 210; the OLED element layer 230 comprises a plurality of light-emitting devices arranged in an array manner; an orthographic projection of the touch structure 240 in the direction along the substrate 210 to the thin film encapsulation layer 220 is not overlapped with a projection of the light-emitting device of the OLED element layer 230 in the direction along the substrate 210 to the thin film encapsulation layer 220.

It should be noted that, in the disclosure, the light-emitting device may be a light-emitting pixel or a light-emitting sub-pixel, so that the OLED element layer 230 may comprise a plurality of light-emitting pixels arranged in an array manner. Alternatively, it can be understood that the OLED element layer 230 may comprise a plurality of light-emitting sub-pixels arranged in an array manner.

In fact, the touch structure of the disclosure comprises a first touch structure and a second touch structure, and the first touch structure is insulatively disposed from the second touch structure.

Specifically, still refer to FIG. 2, the substrate 210 is an array substrate comprising a plurality of thin film transistors arranged in an array manner (not shown in FIG. 2). The OLED element layer 230 is formed on the substrate 210 and comprises a plurality of light-emitting devices 231, and the plurality of light-emitting devices 231 are arranged in an array manner, and each of the light-emitting devices 231 comprises a cathode layer, an anode layer and an organic light-emitting layer disposed between the cathode layer and the anode layer (not shown in FIG. 2). Wherein the anode layer of the light-emitting device 231 is connected to the thin film transistor, and the thin film transistor is used to control the luminescence of the light-emitting device 231. The thin film encapsulation layer 220 is formed on the OLED element layer 230 and used to protect the OLED element layer 230. The touch structure 240 is formed on the thin film encapsulation layer 220.

In this embodiment, the thin film encapsulation layer is used instead of the encapsulating substrate, and the touch structure is directly disposed on the thin film encapsulation layer, thereby reducing the thickness of the touch display panel and further enabling the touch display device to be lighter and thinner.

In the disclosure, the touch structures may specifically have the following structures:

The first touch structure comprises a plurality of first touch electrodes disposed along a first direction, the second touch structure comprises a plurality of second touch electrodes disposed along a second direction, and the first touch electrode is disposed crosswise to the second touch electrode.

Figure 3:
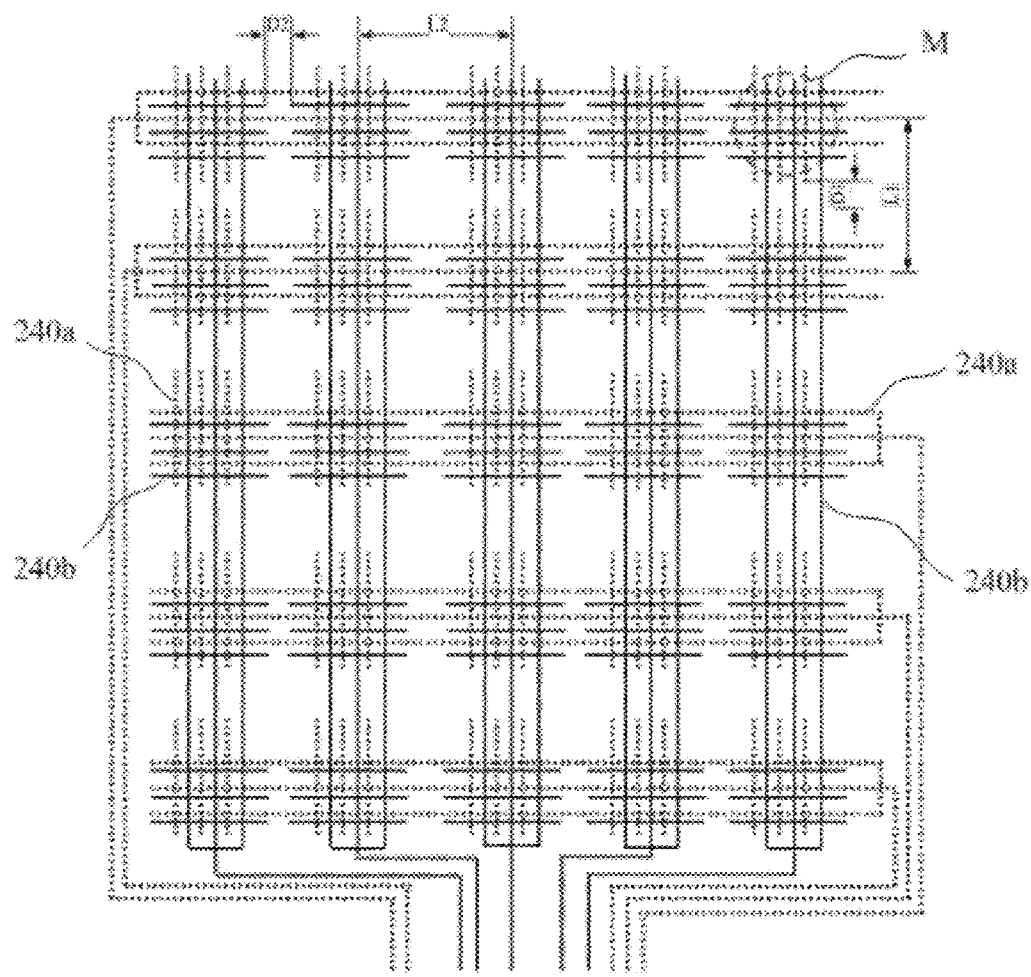
FIG. 3 is a structural schematic view of a touch structure according to an embodiment of the disclosure.

With reference to FIG. 3, the touch structure 240 comprises a plurality of first touch electrodes 240a and a plurality of second touch electrodes 240b, and the first touch electrode 240a is disposed crosswise to and is insulatively disposed from the second touch electrode 240b. In this embodiment, taking a touch unit formed by connecting three adjacent touch electrodes as an example, every three adjacent first touch electrodes 240a are connected to form a first touch unit, and every three adjacent second touch electrodes 240b are connected to form a second touch unit, and the position of the first touch unit one-to-one corresponds to the position of the second touch unit, and a center-to-center distance L2 between adjacent touch units is equal, and an edge-to-edge distance D2 between adjacent touch units is equal.

The center-to-center distance L1 between the adjacent first touch units of the same group and the center-to-center distance L2 between the adjacent second touch units of the same group are set according to the touch precision. The edge-to-edge distance D1 between the adjacent first touch units of the same group and the edge-to-edge distance D2 between the adjacent second touch units of the same group are required to meet the design requirements for small spacing and normal spacing.

In this embodiment, in order to meet the touch requirements for passive touch pens of 2 mm and fingers, the center-to-center distance L1 between the adjacent first touch units is equal to the center-to-center distance L2 between the adjacent second touch units and both are between 3 mm and 6 mm. The edge-to-edge distance D1 between the adjacent first touch units is equal to the edge-to-edge distance D2 between the adjacent second touch units and both are between 1 um and 500 μm.

With reference to FIG. 2 and FIG. 3, in the direction along the substrate 210 to the thin film encapsulation layer 220, the projection of the light-emitting device 231 of the OLED element layer 230 is not overlapped with the projection of the touch structure 240, that is, the positions of the first touch electrode 240a and the second touch electrode 240b are staggered from the position of the OLED element layer 230, and the first touch electrode 240a and the second touch electrode 240b are intersected to form a transparent mesh. Since the light emitted from the OLED element layer 230 may be emitted through the transparent mesh, the first touch electrode 240a and the second touch electrode 240b may adopt an opaque, electrically conductive material.

Structure 2: the first touch structure is a first metal grid layer, the second touch structure is a second metal grid layer, and an insulative layer is sandwiched between the first metal grid layer and the second metal grid layer.

In the embodiment, the touch structure 240 is designed by using a metal mesh structure, that is, the touch structure 240 of the mesh structure is fabricated by using a metal material, which can not only avoid light-emitting sources (the light-emitting devices 231), but also enhance the flexibility of the touch structure.

Optionally, in the solution of the disclosure, the first metal grid layer and the second metal grid layer may be disposed offset from each other. That is to say, a grid point (at an intersection of the transverse metal lines and the longitudinal metal lines) of the first metal grid layer is located at any point in one of grids in the second metal grid layer; a grid point (at an intersection of the transverse metal lines and the longitudinal metal lines) of the second metal grid layer is located at a geometric center of one of grids in the first metal grid layer. Due to staggered arrangement, the visual feel of the touch display panel can be further improved, avoiding the influence of the touch structure in the touch display panel to the display layer. Of course, it can be understood that the first metal grid layer and the second metal grid layer of the disclosure are not limited to the staggered arrangement, and may be disposed without stagger.

Further, the first touch electrode has a plurality of first electrode elements disposed along a second direction, and the second touch electrode each has a plurality of second electrode elements disposed along a first direction; the spacing between the first electrode elements on the two adjacent first touch electrodes is equal to the spacing between the second electrode elements on the two adjacent second touch electrodes.

Figure 5:
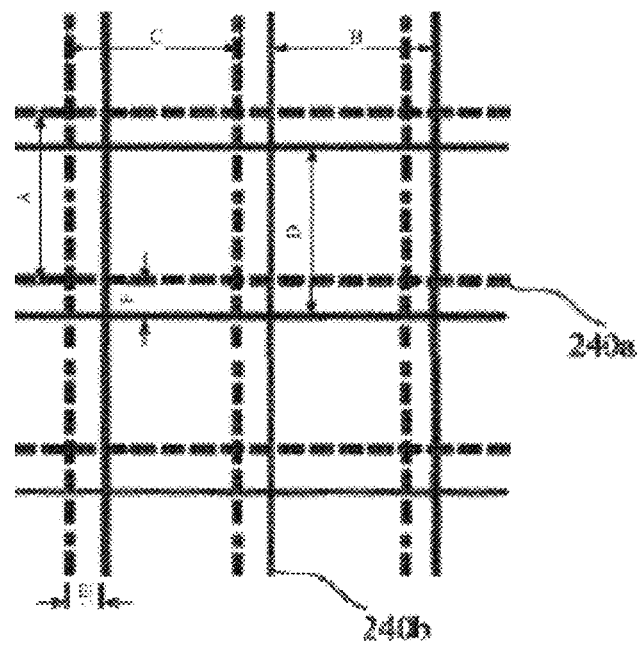
FIG. 5 is an enlarged schematic view of the region M in FIG. 3.

Specifically, still with reference to FIG. 3, the first touch electrode 240a has a plurality of the first electrode elements disposed along the second direction, and the second touch electrode 240b each has a plurality of the second electrode elements disposed along the first direction. In this embodiment, the first direction is a transverse direction, and the second direction is a longitudinal direction. That is to say, the first touch electrode 240a and the second electrode elements of the second touch electrode 240b are transversely disposed, and the second touch electrode 240b and the first electrode elements of the first touch electrode 240a are longitudinally disposed. The size designs for the first touch electrode 240a and the second touch electrode 240b are required to avoid the light-emitting device 231 of the OLED element layer 230 to eliminate moire phenomenon in appearance, and to meet the requirement for capacitance Induction quantity at a node of a mutual capacitance touch screen, achieving the best appearance and touch feel. As shown in FIG. 5, the spacing A between the adjacent first touch electrodes 240a is equal to the spacing B between the adjacent second touch electrodes 240b, and both are between 0.1 mm and 6 mm. The spacing C between the adjacent first electrode elements on the first touch electrode 240a is equal to the spacing D between the adjacent second electrode elements on the second touch electrode 240b, and are between 0.1 mm and 6 mm. The spacing E between the first electrode elements on the first touch electrode 240a and its adjacent second touch electrode 240b is equal to the spacing F between the second electrode elements on the second touch electrode 240b and its adjacent first touch electrode 240a, and both are between 0.001 mm and 0.1 mm.

On the basis that the production yield is ensured, the wire widths of the first touch electrode 240a and the second touch electrode 240b are required to be as small as possible in order to meet the wiring requirements between the pixels. In this embodiment, the wire widths of the first touch electrode 240a and the second touch electrode 240b are equal and between 0.001 mm and 0.020 mm.

Figure 4:
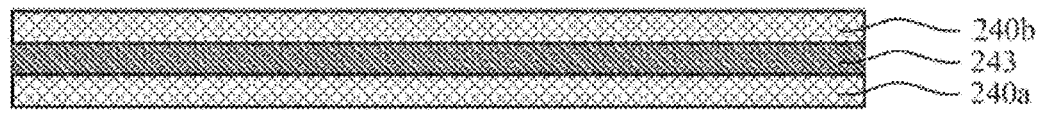
FIG. 4 is a cross-sectional view of a touch structure according to an embodiment of the disclosure.

Please with reference to FIG. 4, FIG. 4 is a cross-sectional view of a touch structure according to an embodiment of the disclosure. As shown in FIG. 4, the touch structure 240 is a double-layer metal structure, and the first touch electrode 240a is a first metal layer (i.e., an emission layer), and the second touch electrode 240b is a second metal layer (reception layer), and an insulative layer 243 is disposed between the first touch electrode 240a and the second touch electrode 240b, and the thickness of the insulative layer 243 is related to the volume of a product, and such volume may be adjusted by adjusting the thickness of the insulative layer 243.

Materials for the first metal layer (i.e., the first touch electrode 240a) and the second metal layer (i.e., the second touch electrode 240b) may be metal materials, such as molybdenum aluminum molybdenum (Mo/AL/Mo), titanium aluminum titanium (Ti/AL/Ti) or silver (Ag). Materials for the insulative layer may be insulative materials, such as silicon oxide (SiOx), silicon nitride (SiNx) or silicon oxynitride (SiOxNy).

In the embodiment, the touch structure 240 adopts a double-layer metal structure, namely, the emission layer and the reception layer are located on the upper and lower metal layers respectively. As a result, the high voltage of the emission layer can shield the interfering signal such that signals received by the reception layer are more accurate, thus increasing sensitivity. Moreover, the spacing of the double-layer metal structure (i.e., the thickness of the insulative layer 243) can be adjusted to accommodate different types of products.

In the embodiment, the substrate 210 is a flexible substrate (for example, a transparent plastic substrate), and the touch display panel 200 is a flexible touch display panel. In other embodiments, the substrate 210 may be a hard substrate (for example, a transparent glass substrate), and the touch display panel 200 is a hard touch display panel.

Based on any one of the above solutions, in the disclosure, considering that the orthographic projection of the touch structure on the substrate is not overlapped with the orthographic projection of the light-emitting device of the OLED element layer on the substrate, and thus the touch wiring in the touch structure may be arranged at the gap of the corresponding light-emitting device of the OLED element layer, and there is necessarily the fact that the wire width of the touch wiring is smaller than the gap between two adjacent light-emitting devices.

Figure 6A:
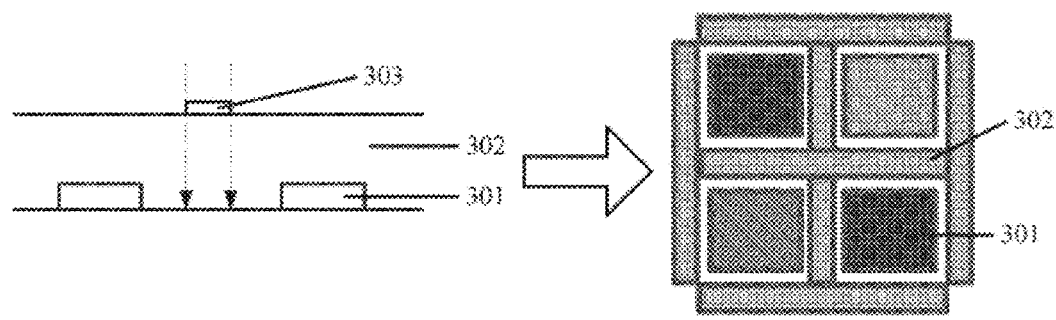
FIG. 6(a) is a principle diagram of a perspective for a light-emitting device and a touch structure when the touch structure is viewed from the front.
Figure 6B:
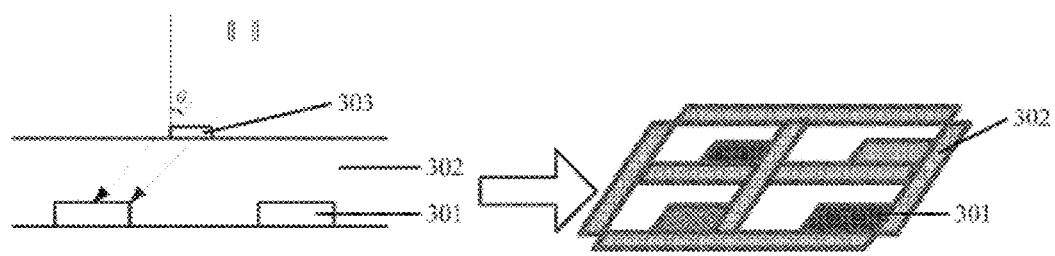
FIG. 6(b) is a principle diagram of a perspective for a light-emitting device and a touch structure when the touch structure is viewed from a viewing angle.

Although the touch structure is disposed between the adjacent light-emitting devices and kept away from the position of the light-emitting device, the fact the light emitted by the light-emitting device is obstructed by the touch structure cannot be completely eliminated. As shown in FIG. 6(a) and FIG. 6(b), this is because the thin film encapsulation layer 302 on the light-emitting device 301 has a certain thickness, and the touch structure 303 is located on the thin film encapsulation layer 302, and when viewed from the front of the touch panel, the touch structure 303 does not obstruct the light-emitting device 301; however, when viewed from a viewing angle, if the size of the touch structure is too large, the light is still obstructed, thereby reducing the display luminance and affecting the quality of viewing. Here, the viewing angle refers to the viewing angle when the luminance is reduced to 50%. In other words, this is the limit of luminance reduction, and the touch structure may obstruct up to 50% of the light-emitting area of a single light-emitting device.

Therefore, the disclosure proposes a solution, that is to say, by properly designing the wire width of the touch wiring of the touch structure, to avoid the light-emitting device from being obstructed by the touch wiring when viewed from the viewing angle; as for the gap corresponding to any one of the adjacent light-emitting devices, the distances between the two outermost sides of the touch structure and the center of the gap are not greater than a preset threshold; wherein a difference value is obtained by subtracting the preset threshold from the sum of a ½ length value of the light-emitting device and the gap spacing value, and a ratio of the difference value to the thickness value of the thin film encapsulation layer is a tangent value of the viewing angle of the touch display panel.

Figure 7A:
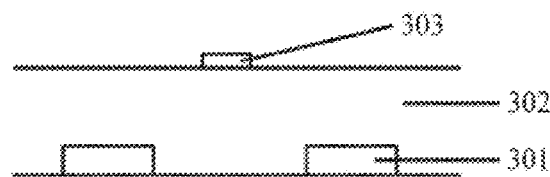
FIG. 7(a)-7(b) are schematic views showing two situations of the touch structure at a gap.

It should be noted that the touch structure can be understood as the following situations:

Situation 1: intersected electrode strips, correspondingly, the touch structure at the gap is only a first touch wiring or a second touch wiring, as shown in FIG. 7(a).

Figure 7B:
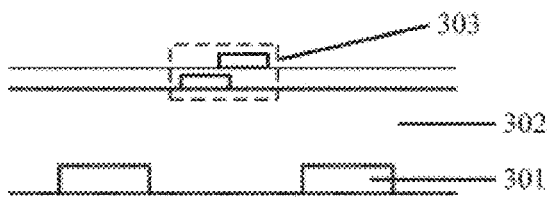

Situation 2: the staggered grid electrode, the touch structure at the gap comprises the first touch wiring and second touch wiring, and as shown in FIG. 7(b), the orthographic projection of the first touch wiring on the substrate is partially overlapped or is not overlapped with the orthographic projection of the second touch wiring on the substrate.

Figure 8:
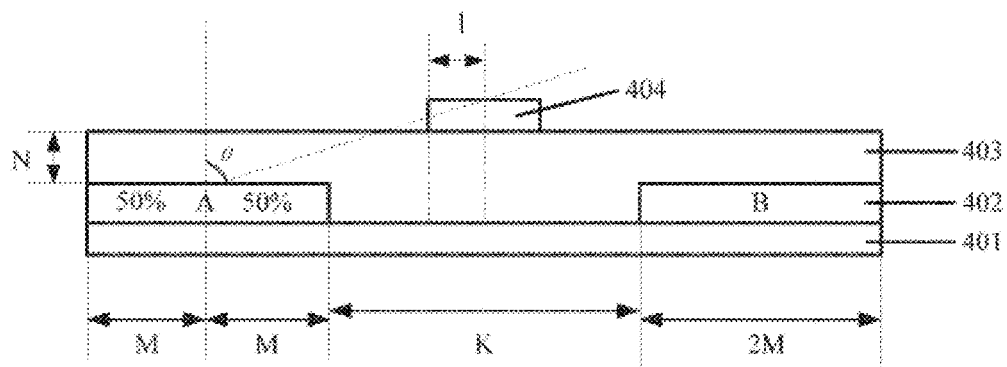
FIG. 8 is a first schematic view for positions of any two adjacent light-emitting devices of the touch display panel.

Specifically, with reference to FIG. 8, a schematic cross-sectional view of the position of any two adjacent light-emitting devices of the touch display panel, wherein the light-emitting device A and the light-emitting device B are located on a substrate 401 (the upper surface as shown in FIG. 8), and a light-emitting layer 402 at which the light-emitting device A and the light-emitting device B is located is covered by a thin film encapsulation layer 403, and a touch structure 404 is disposed on the surface of the thin film encapsulation layer 403. In fact, a touch wiring S is shown in FIG. 8. There may also be two touch wirings at the gap, which are staggered or located in different film layers, specifically refering to the above situation 1-situation 2.

With reference to FIG. 8, the distance between the two outermost sides of the touch structure 404 (only one touch wiring herein) and the center of the gap is not greater than a preset threshold; that is to say, the width of the area occupied by the touch structure 404 is not greater than twice of the preset threshold. Wherein a difference value is obtained by subtracting the preset threshold from the sum of the ½ length value of the light-emitting device and spacing value between the gaps, and a ratio of difference value to the thickness value of the thin film encapsulation layer is a tangent value of the viewing angle of the touch display panel.

Moreover, based on FIG. 8, the thickness value of the film layer of the touch wiring in the touch structure is negatively correlated with the width value of the touch wiring. After the preset threshold is determined, it can be determined that the touch wiring is set within an area range in which the distance from the center of the gap (shown by a broken line) is a preset distance.

Still with reference to FIG. 8, wherein, according to the law of triangles, the tangent value of the viewing angle is associated with the thickness of the thin film encapsulation layer, the half value of the spacing of the adjacent light-emitting devices, the half value of the width of the single light-emitting device, and the half wire width value.

Specifically, the wire width of the touch wiring in the touch structure meets the following equation:

$$L \leq 2^*l - \alpha = 2^*[K/2 - (N^*\tan\theta - M)] - \alpha \quad (1)$$

wherein, L is a wire width of the touch wiring, l is a ½ wire width of the touch wiring, a is an engineering capability error, K is a gap spacing corresponding to the adjacent light-emitting devices, M is a ½ length of the light-emitting device, N is the thickness of the thin film encapsulation layer, and θ is a viewing angle of the touch display panel.

In the actual process, the engineering capability error α=ΔAlign+ΔCDRange, wherein ΔAlign is the device alignment accuracy; ΔCDRange is the wire width process floating value. The spacing K between the gaps corresponding to the adjacent light-emitting device is 20 μm; the ½ length M of the light-emitting device is 10 μm; the thickness N of the thin film encapsulation layer is 8 μm; the device alignment accuracy ΔAlign is ±0.5 μm; and the wire width process floating value ΔCDRange is ±0.5 μm.

The wire width of the touch wiring obtained by calculating according to the above values is less than or equal to 5.36±1.0 μm. In fact, according to the conventional RGB three primary color light-emitting device arrangement, the wire width of the touch wiring should be controlled below 4.36 μm, which is within the scope of process safety, when the 260 PPI resolution is designed. It should be noted that the wire width of the touch wiring is only for the situation where one touch wiring is disposed in the gap in FIG. 8, and is only a theoretical calculation, and the actual process may have a certain deviation.

The above description is merely explanation of principle based on the situation of FIG. 8 as an example. The touch structures in other situations may also be designed in a similar manner, and it is mainly ensured that the light-emitting devices are not obstructed by 50% when viewed from a viewing angle.

In fact, in the disclosure, considering the existence of the thin film encapsulation layer, the line of sight must be refracted in the thin film encapsulation layer when viewed from the viewing angle. Therefore, it is necessary to pay attention to the influence of the refractive index of the thin film encapsulation layer on the line of sight.

Figure 9:
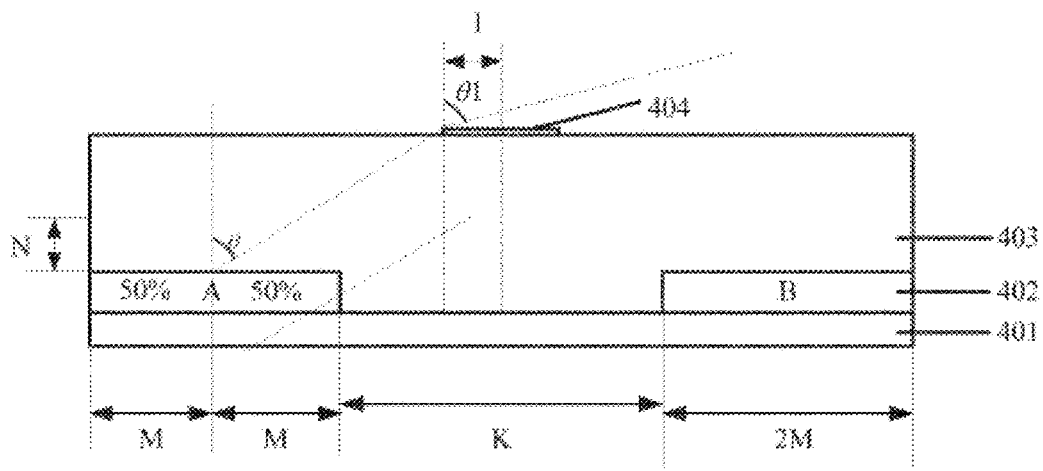
FIG. 9 is a second schematic view for positions of any two adjacent light-emitting devices of the touch display panel.

With reference to FIG. 9, without considering the thickness of the touch wiring in the touch structure, it is assumed that the line of sight is transmitted as light, and is entered into the film encapsulation film layer from the transparent protective layer on the touch wiring, and is refracted at the interface, and then goes into the light-emitting device. Conversely, when the light-emitting device emits light, it propagates along a similar path. Specifically, the wire width of the touch wiring in the touch structure meets the following equation:

$$L = 2^*/-\alpha = 2^*[K/2 - (N^*\tan(90° - \theta 1) - M)] - \alpha \quad (2)$$

$$\frac{\sin\theta}{\sin\theta_1} = n \quad (3)$$

wherein, L is a wire width of the touch wiring, l is a ½ wire width of the touch wiring, α is an engineering capability error, K is a gap spacing corresponding to the adjacent light-emitting devices, M is a ½ length of the light-emitting device, N is the thickness of the thin film encapsulation layer, θ is a viewing angle of the touch display panel, $\theta_1$ is a refraction angle of the viewing angle after entering the film encapsulation layer, and n is a refractive index of the film encapsulation layer.

Therefore, according to the above technical solution, the touch structure is disposed at the gap of the adjacent light-emitting devices to avoid the light-emitting device from being obstructed by the touch wiring when viewed from the front side; and the disclosure also considers obstructing issue existed when viewed from the viewing angle, and excessive obstruction of the light-emitting device is avoided by reasonably designing the wire width of the touch wiring, and it is at least ensured that 50% of the light-emitting area of the light-emitting device is not obstructed when viewed from the viewing angle, thereby ensuring the light emission efficiency of the touch panel and improving the display quality of the touch panel as a whole.

Optionally, in the touch structure of the disclosure, at least one touch wiring S disposed along any one of the axial directions comprises a plurality of electrode segments sequentially connected, and the touch wiring S meets at least the following rule: the arranging angles of any two adjacent electrode segments are different.

Figure 10:
FIG. 10 is a first structural schematic view of a touch wiring provided by the disclosure.

It should be noted that, in the disclosure, with reference to FIG. 10, the axial direction refers to the extending direction from the starting point of the electrode segment L1 at the first position to the end point of the electrode segment Ln at the last position in the touch wiring S. The axial direction here may be understood as an extended arrangement trend, and it is not required to be arranged in a straight line.

By the above manner, at least one touch wiring in the touch structure is irregularly arranged, and then the touch structure has an irregularly arranged pattern. Compared with the prior art in which all is a regular arrangement pattern, the disclosure can achieve the purpose of eliminating the interference of moire in a partial region to some extent, improving the display performance and the display quality of the touch display panel.

In fact, the thin film encapsulation layer in the touch display panel is located between the substrate and the touch structure, and the display layer is located between the substrate and the thin film encapsulation layer. The thin film encapsulation layer is used to encapsulate and protect light-emitting devices in an array manner in the display layer. And a protective layer is located above the touch structure and used to protect the touch structure, wherein the protective layer is made of silicon oxide or acrylic material.

In addition, as an optional structure, the thin film encapsulation layer is composed of a plurality of insulative sub-film layers, and the touch structure may be sandwiched between any two adjacent sub-film layers of the thin film encapsulation layer, so that, on the one hand, the touch structure may be packaged and protected from being damaged or oxidized; on the other hand, the thickness of the touch structure may be used to replace other insulative sub-film layers in the thin film encapsulation layer, thereby appropriately reducing the thickness of the thin film encapsulation layer and advantageously achieving the touch panel having a slim and light design. Correspondingly, when the touch structure may be sandwiched between any two insulative sub-film layers of the thin film encapsulation layer, no additional protective layer is needed, and the outermost insulative sub-film layer of the thin film encapsulation layer may serve to cover and protect the touch structure.

Optionally, in the disclosure, based on the above solution, the arranging angles of all electrode segments L in the touch wiring S are different. Therefore, in the formed pattern, the adjacent patterns in the axial direction of the touch wiring are different, and all patterns in the axial direction of the same touch wiring are different, thereby eliminating the Moire interference that may exist between the patterns formed by the touch wiring in the current axial direction, improving the display performance and the display quality of the touch panel.

Figure 11:
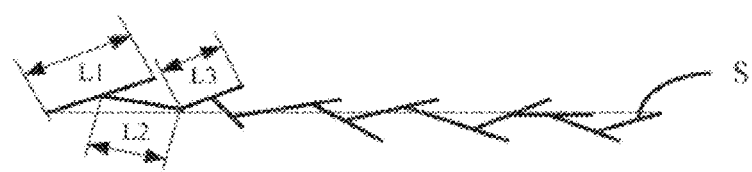
FIG. 11 is a second structural schematic view of a touch wiring provided by the disclosure.

Further, in the disclosure, the touch wiring also meets the following arrangement rule: the lengths of any two adjacent electrode segments are different. With reference to FIG. 11, the touch wiring S comprises electrode segments L1-Ln sequentially connected, wherein the length of L1 is different from the length of L2, and the length of L2 is different from the length of L3; the length of L1 is equal to or different from the length of L3. Preferably, it may be provided that the lengths of all electrode segments are not equal. Therefore, based on the above-mentioned arrangement rule, under the arrangement rule of different arranging angles and/or different electrode segment lengths, it is easier to form an irregular arrangement pattern and increase the number of irregular patterns, thereby eliminating more Moire Interference, further improving the display performance and display quality of the touch panel.

It should be noted that, in the disclosure, in the touch wiring including the plurality of electrode segments sequentially connected, each electrode segment may be connected end to end, and one end of one electrode segment overlaps with either end of another electrode segment; or it may not be connected end to end, but in adjacent electrode segments, one end of one electrode segment overlaps with the non-end portion of another electrode segment.

In a preferred implementation manner, at least one group of two adjacent touch wirings are arranged in different manners in the same axial arrangement direction.

Optionally, for any solution involved with the disclosure, the number of electrode segments comprised in each touch wiring is different in the same axial arrangement direction.

Optionally, in the disclosure, a light-absorbing film layer is provided on a surface of the touch wiring S in the touch structure near the substrate. Using the light-absorbing film layer to obstruct the touch wiring, when the display film layer emits light, even if a monochromatic light is emitted to the position at which the touch wiring is, the light is absorbed by the light-absorbing film layer under the touch wiring without emitting the monochromatic light to adjacent other monochromatic light-emitting areas, thereby avoiding the problem of mixing of pixel color across adjacent pixels and improving the color contrast of the display.

Optionally, in the disclosure, the electrically conductive material in the touch structure is at least one or more combinations of molybdenum aluminum molybdenum, titanium aluminum titanium, and silver, and the material for the insulative layer is at least one or more combinations of silicon oxide, silicon nitride and silicon oxynitride.

Figure 12:
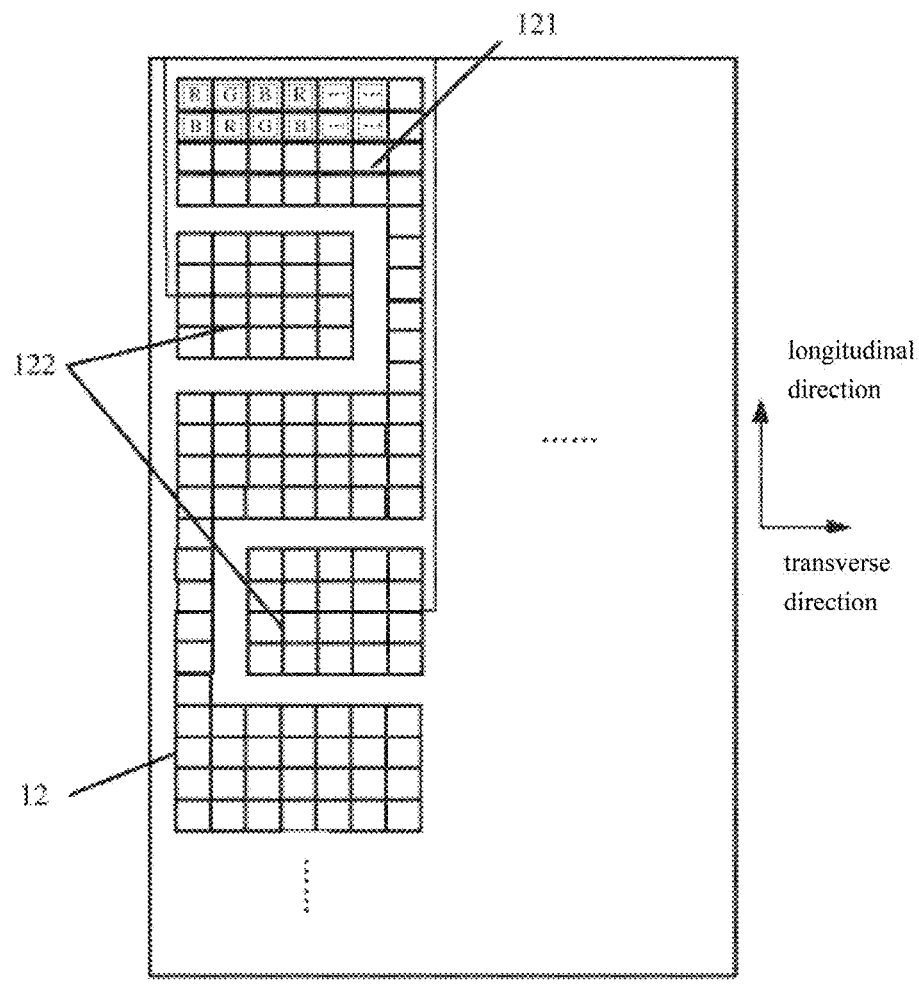
FIG. 12 is a first partial structural schematic view of a touch display panel provided by the disclosure.

FIG. 12 is a structural schematic view of a touch display panel provided by an embodiment of the disclosure. The touch panel mainly comprises: a touch structure 12; wherein the touch structure 12 comprises a plurality of first touch electrodes 121 and the plurality of second touch electrodes 122 which are insulated from the first touch electrodes 121 and are alternately arranged. The first touch electrodes 121 and the second touch electrodes 122 each have a hollow-out pattern, and wherein the hollow-out pattern may be specifically a grid shape or an irregular polygon shape.

In fact, only a part of the touch display panel is shown in the above schematic view 1. In the actual touch display panel, a plurality of similar touch units are arranged in an array manner, and the touch units are periodically arranged on the touch panel to form touch structures.

According to the above technical solution, the first touch electrode and the second touch electrode are not insulated and overlapped by the bridge structure, but the touch electrodes have hollow-out patterns and are disposed in the same layer, the first touch electrode and the second touch electrode are alternately arranged, that is a portion of the first touch electrode extends into the gap of the second touch electrode, and a portion of the second touch electrode extends into the gap of the first touch electrode, thereby achieving the capacitive touch mode in the same layer, avoiding the breakage problem caused by the bridge in the prior art, ensuring the touch effect of the touch film layer, and improving the yield and performance of the touch panel.

Specifically, in the disclosure, the following structures of the touch unit may be existed specifically:

Structure 1:

A first touch electrode has a bent pattern, and a second touch electrode is alternated in each gap of the bent pattern of the first touch electrode.

Figure 13A:
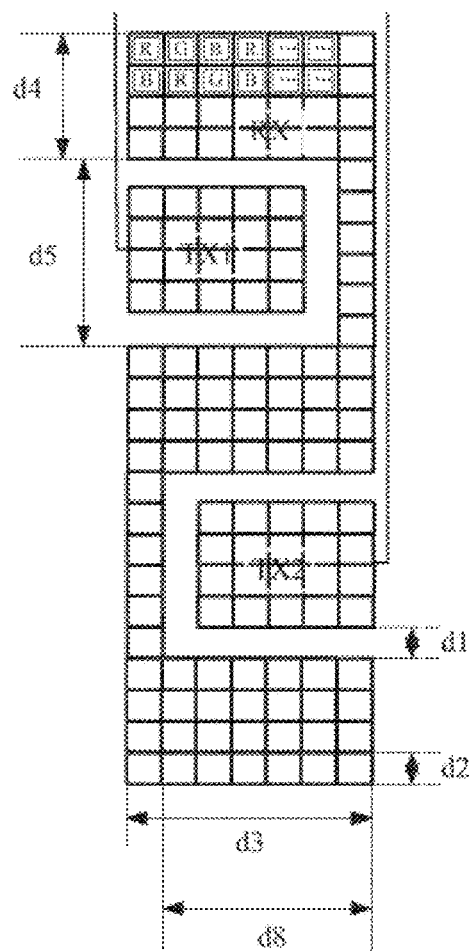
FIG. 13(a)-13(c) are schematic views showing three touch structures of the touch display panel provided by the disclosure, respectively.

With reference to FIG. 13(*a*), the first touch electrode RX may be a bent pattern extending along the longitudinal direction of the substrate (i.e., the longitudinal direction of the pattern shown in FIG. 13(*a*)). Each bent pattern itself is formed with a plurality of gaps, and the width d5 of the gap in the longitudinal direction is larger than the width d4 of the pattern between two adjacent gaps in the bent pattern in the longitudinal direction; the length d8 of the gap in the transverse direction does not exceed the length d3 of the pattern between two adjacent gaps in the bent pattern in the transverse direction. Optionally, each gap has an equal width and each gap has an equal length. In each gap, one second touch electrode is alternated insulatively. As shown in FIG. 13(a), the second touch electrodes TX1 are alternated in the gap of the first touch electrode RX facing the left side opening. The second touch electrodes TX2 are alternated in the gap of the first touch electrode RX facing the right side opening. The same layer design adopts a mesh electrode and adopts a structure in which the same layer is insulatively alternated, thereby avoiding the fracture problem caused by the bridge structure, and compared with the double layer touch structure, touch sensing of the same layer touch structure is more sensitive.

Still with reference to FIG. 13(a), the leads of the second touch electrodes are respectively led out from the openings of the bent pattern. Wherein the lead of the second touch electrode TX1 is led out from the gap of the left side opening, and may be led to the wiring area; similarly, the lead of the second touch electrode TX2 is led out from the gap of the right side opening and may be led to wiring area. As can be seen, in the touch structure shown in FIG. 13(a), the first touch electrode may not be designed with a lead, or may be directly led out from the position of the first touch electrode near the wiring area, and the leads of the second touch electrode are respectively led out from both sides of the first touch electrode with occupying a certain wiring space.

Structure 2:

The first touch electrode has a plurality of first electrode elements extending along a transverse direction, and the second touch electrode has a plurality of second electrode elements extending along a transverse direction; the plurality of first electrode elements are located in the same column, the plurality of second electrode elements are located in the same column, and the first electrode element and the second electrode element are alternately arranged with each other.

Specifically, the first touch electrode has a first comb pattern disposed along a preset direction, and the first comb pattern comprises a plurality of first electrode elements. The second touch electrode has a second comb pattern disposed along a preset direction, and the second comb pattern comprises three second electrode elements. The first touch electrode and the plurality of second touch electrodes are alternately arranged with each other.

Figure 13B:
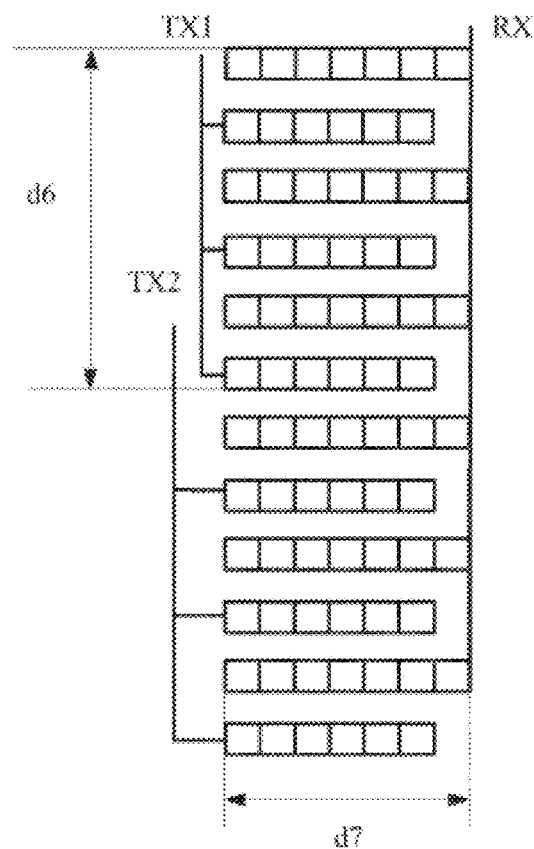
Figure 13C:
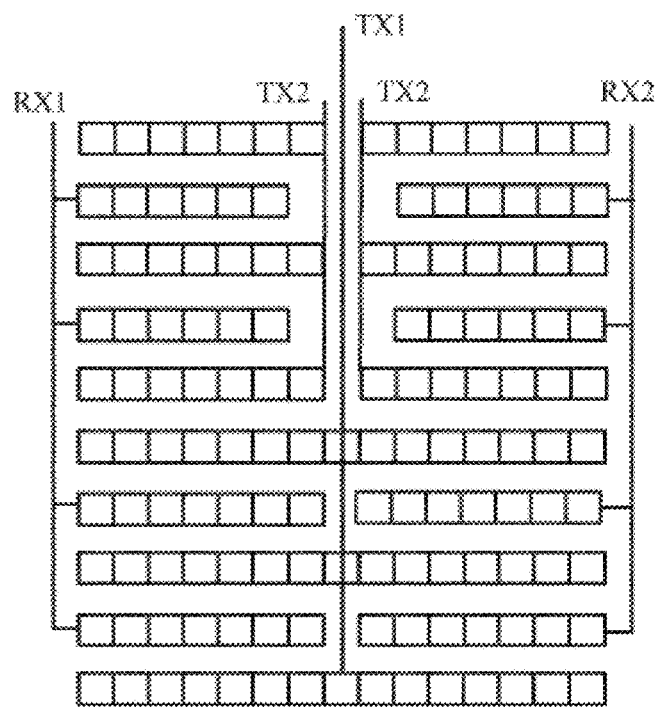

With reference to FIG. 13(b), the first touch electrode RX may be a first comb pattern longitudinally extending along the substrate, and the teeth (i.e., the first electrode element) of the first comb pattern are transversely arranged and faced the left side of the touch panel, as shown in FIG. 13(b), the first touch electrode RX is composed of six teeth, which form a plurality of gaps; similarly, the second touch electrode TX can be a second comb pattern longitudinally extending along the substrate, and the teeth of the second comb pattern face the right side of the touch panel, and the second touch electrode TX is composed of three teeth, which form a plurality of gaps; teeth of the second touch electrodes are alternately provided at each gap of the first touch electrode RX, and teeth of the first touch electrodes are alternately provided at each gap of the second touch electrode TX; wherein, from top to bottom, the second touch electrode TX1 is alternately provided at the first gap to the third gap of the first touch electrode RX, and the three teeth of the second touch electrode TX1 are respectively alternately provided at the gaps of the first touch electrode RX; the second touch electrode TX2 is alternately provided at the fourth gap to the sixth gap of the first touch electrode RX, and the three teeth of the second touch electrode TX2 are respectively alternately provided at the gaps of the first touch electrode RX. The same layer design adopts a mesh electrode and adopts a structure in which the same layer is insulatively alternated, thereby avoiding the fracture problem caused by the bridge structure, and compared with the double layer touch structure, touch sensing of the same layer touch structure is more sensitive.

It should be noted that, in the disclosure, the teeth (i.e., the first electrode element or the second electrode element) of the first touch electrode RX and/or the second touch electrode TX are respectively connected by leads or the connected grid pattern; in other words, the lead or the connected grid pattern serves as a comb handle to connect the plurality of teeth together to form the first touch electrode RX or the second touch electrode TX. In fact, considering that the grid pattern would occupy a certain space, thus in order to avoid occupying the light-emitting area of the display panel, it is preferable to connect the respective teeth by leads.

Still with reference to FIG. 13(b), the leads of the second touch electrodes are led out from the same side, wherein the first touch electrode leads out the lead from one side of the touch panel, and the second touch electrode leads out the lead from the other side of the touch panel, and the leads are respectively introduced into the wiring area.

In fact, in the structure 2, another touch unit is also involved, which also has a comb pattern; the difference is the touch unit in which two first touch electrodes RX are alternately provided in a single second touch electrode TX; as the structure is relatively special, description is made in the following by taking two touch units as an example. Specifically with reference to FIG. 13(c), the second touch electrodes TX are generally designed as two comb patterns separated from each other, as shown in the figure, the second touch electrode TX2 is divided into two left and right comb patterns, each comb pattern has three teeth (i.e., the first electrode element or second electrode element), and teeth are disposed facing the back, namely the teeth of the comb pattern of the second touch electrode TX2 on the left side is faced toward the left side opening, and the teeth of the comb pattern of the second touch electrode TX2 on the right side is faced toward the right side opening; correspondingly, the teeth of the first touch electrode RX1 are alternately provided in the gap of the second touch electrode TX2 on the left side, and the teeth of the first touch electrode RX2 are alternately provided in the gap of the second touch electrode TX2 on the right side. Wherein, the lead of the first touch electrode RX1 is led out from the left side of the touch unit, and the lead of the first touch electrode RX2 is led out from the right side of the touch unit; the lead of the second touch unit TX2 is led out from the middle gap (the gap between the second touch electrode TX2 on the left side and the second touch electrode TX2 on the right side) of the touch unit.

It should be noted that, in the structure, since the second touch electrode TX1 is located at the bottom, no lead of the other second touch electrodes are led out under the second touch electrode TX1, so the second touch electrode TX1 on the left side and the second touch electrode TX1 on the right side that should be separately disposed may be integrated into one body, that is, led out through one lead.

In fact, the solution of the disclosure is not limited to the graphics of other similar touch structures, as long as they are of the same layer insulation design, and can be alternately provided.

Optionally, in the disclosure, the spacing between the first touch electrode and the adjacent second touch electrode is an integer multiple of the size of a single hollow-out pattern. Still with reference to FIG. 13(a), the spacing d1 between the first touch electrode RX and the adjacent second touch electrode TX is an integer multiple of the size d2 of the grid (assuming that the grid is a square, the size of the hollow-out pattern is regarded as side of the square), thereby ensuring insulation arrangement between the adjacent touch electrodes.

Actually, in FIG. 13(a), the length d3 of the pattern between two adjacent gaps in the bent patterns in the transverse direction is in the range of 3 to 6 µm. The sum of the width d4 of the gap in the longitudinal direction and the width d5 of the pattern between two adjacent gaps in the bent patterns in the longitudinal direction is in the range of 2 to 6 µm. In FIG. 13(b), the width d6 of a second touch electrode TX longitudinally extending along the substrate is in the range of 2 to 6 µm, and the length d7 of the single tooth in the transverse direction is in the range of 3 to 6 µm.

Figure 14:
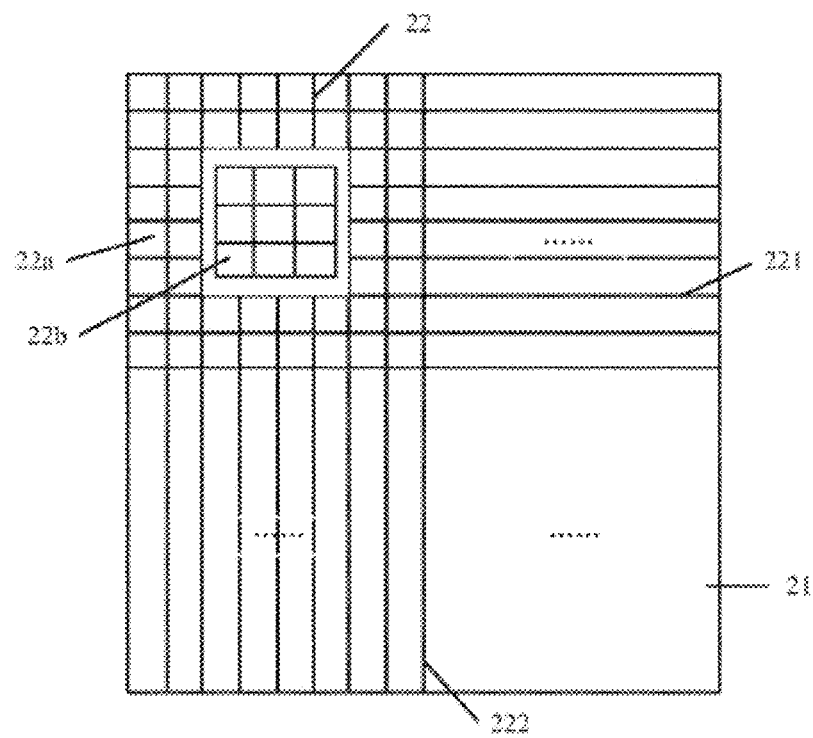
FIG. 14 is a second structural schematic view of the touch display panel provided by the disclosure.

FIG. 14 is a structural schematic view of a touch panel provided by the disclosure. The touch panel mainly comprises a substrate 21, a touch structure 22 on a surface of the substrate 21, and the first touch structure 221 is insulated from the second touch structure 222 in the touch structure 22; wherein, the touch structure 22 comprises a touch electrode 22a and at least one compensation electrode 22b that is insulatively embedded in the hollow-out region of the touch electrode 22a.

Figure 15:
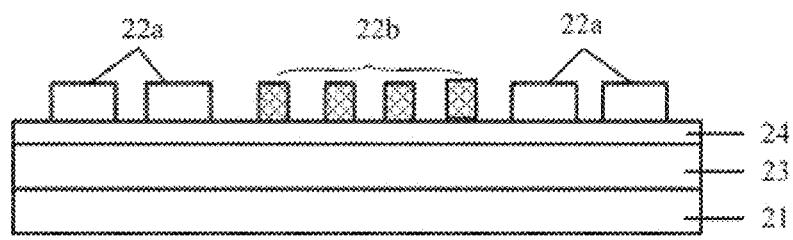
FIG. 15 is a first structural schematic view of the touch display panel provided by the disclosure.

Actually, as shown in FIG. 15, a display layer 23 and a thin film encapsulation layer 24 are further disposed between the substrate 21 and the touch structure 22. Thus, the capacitance between the electrically conductive film layer (an anode or a cathode) near the touch structure 22 in the display layer 23 and the touch structure 22 is only the capacitance between the touch electrode 22a and the electrically conductive film layer in the display layer 23. Since the compensation electrode 22b is insulated from the touch electrode 22a and does not have a current there between, there is no capacitance between the compensation electrode 22b and the electrically conductive film layer in the display layer 23. Therefore, the capacitance generated by the touch structure 22 and the display layer 23 is reduced by reducing the actual conduction area of the touch electrode 22a, and thus the capacitance between the touch structure 22 and the electrically conductive film layer of the display layer 23 is not excessively large, thereby reducing the driving pressure of the driving IC on the touch structure and improving the overall driving effect.

Based on the above structure, in terms of a grid electrode, at least one first compensation electrode is embedded in the first touch electrode; and/or, at least one second compensation electrode is embedded in the second touch electrode.

Figure 16A:
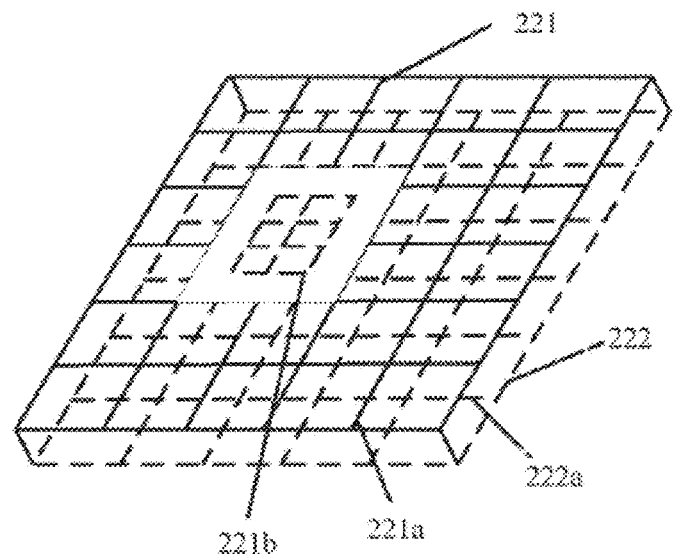
FIG. 16(a) to FIG. 16(c) are schematic views showing the arrangement of compensation electrodes in three situations of the touch structure provided by the disclosure.

Situation 1: specifically, with reference to FIG. 16(a), the first touch structure 221 comprises a first touch electrode 221a, and a first compensation electrode 221b is also insulatively embedded in the hollow-out area of the first touch electrode 221a. Wherein, there may be a plurality of hollow-out regions in the first touch electrode 221a, and each of the hollow-out regions is provided with the compensation electrode 221b. The second touch structure 222 comprises only the first touch electrode 222a, and the second compensation electrode does not exist.

Figure 16B:
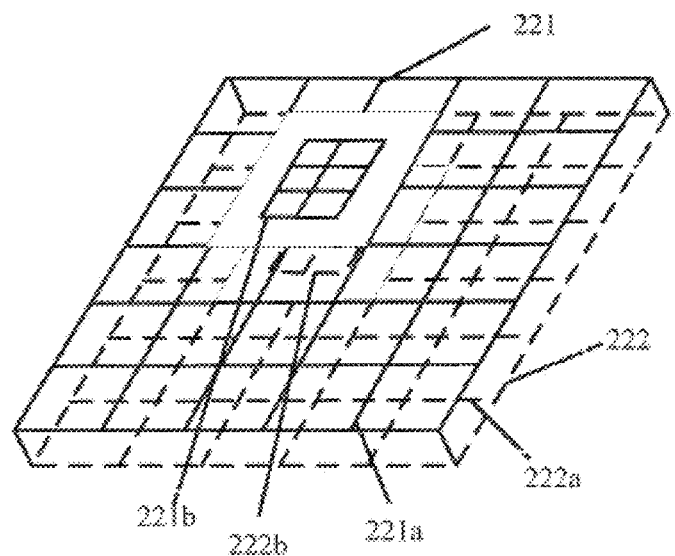

Situation 2: Specifically, with reference to FIG. 16(b), the first touch structure 221 comprises the first touch electrode 221a, and the first compensation electrode 221b is also insulatively embedded in the hollow-out area of the first touch electrode 221a. There may be a plurality of hollow-out regions in the first touch electrode 221a, and each of the hollow-out regions is provided with the first compensation electrode 221b. At the same time, the second touch structure 222 comprises a second touch electrode 222a, and a second compensation electrode 222b is insulatively embedded in the hollow-out region of the second touch electrode 222a. wherein, there may be a plurality of hollow-out regions in the second touch electrode 222a, and each of the hollow-out regions is provided with the second compensation electrode 222b.

Figure 16C:
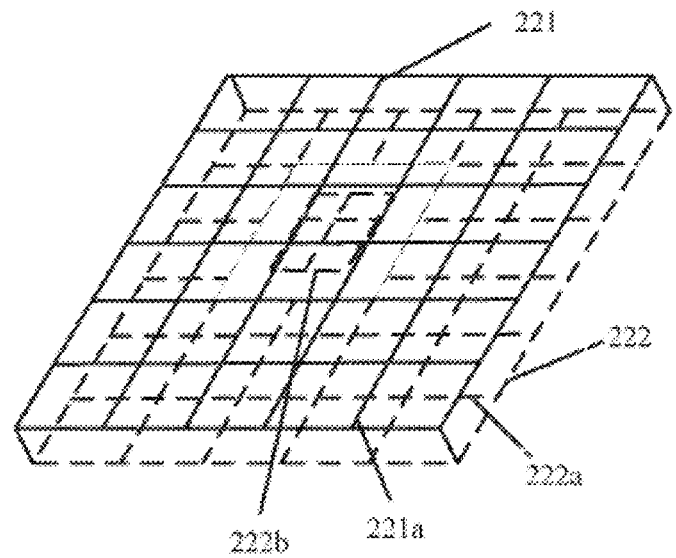

Situation 3: With reference to FIG. 16(c), the first touch structure 221 comprises only the first touch electrode 221a, and there is no compensation electrode in the first touch structure 221. The second touch structure 222 comprises the second touch electrode 222a, and the second compensation electrode 222b is insulatively embedded in the hollow-out region of the second touch electrode 222a. Wherein, there may be a plurality of hollow-out regions in the second touch electrode 222a, and each of the hollow-out regions is provided with the second compensation electrode 222b.

Therefore, in the above three situations, the compensation electrodes are disposed in the touch structure so that the capacitance between the touch structure and the electrically conductive film layer of the display layer may be reduced to different degrees, and the driving pressure of the driving IC is reduced, the driving difficulty is reduced and the driving effect is improved. Especially for the structure in which the compensation electrodes are disposed both in the first touch structure and the second touch structure, the capacitance between the touch structure and the electrically conductive film layer of the display layer may be reduced, and the capacitance of the touch structure itself (the capacitance between the first touch structure and the second touch structure) is also reduced, thereby further reducing the driving pressure of the driving IC and improving the driving effect.

It should be noted that, in the disclosure, the shape of the compensation electrode involved is adapted to the shape of the hollow-out region of the touch electrode. Optionally, the shape of the compensation electrode may be a rectangle or a circle or a triangle, etc., which is not limited in this disclosure.

Figure 17:
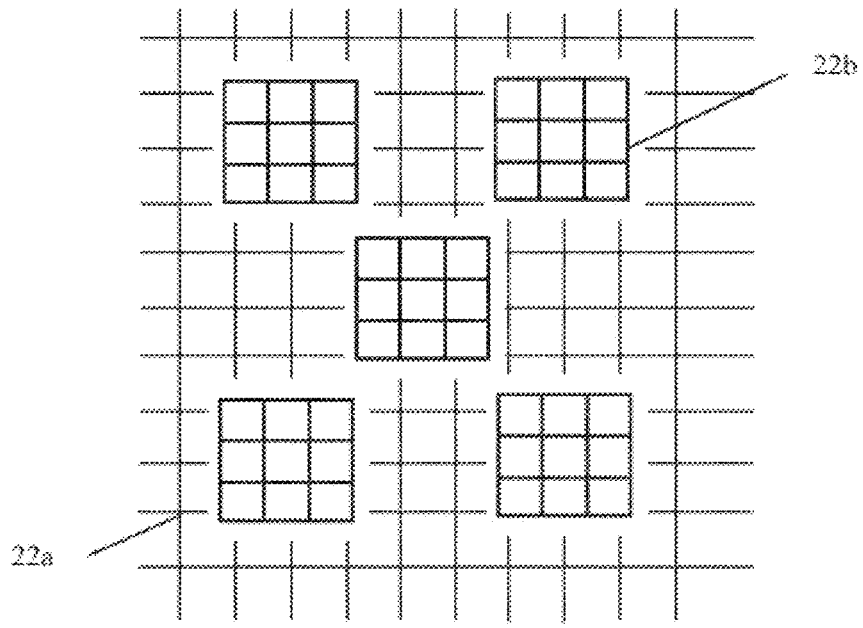
FIG. 17 is a top schematic view of a touch structure provided by the disclosure.

Optionally, in the disclosure, a preferred implementation manner is that an area orthographically projected on the substrate by the compensation electrode in the touch structure is equal to an area orthographically projected on the substrate by the touch electrode. For example, as shown in FIG. 17, which is a top view of a touch structure provided by an embodiment of the disclosure, wherein the touch structure comprises a touch electrode 22a, and five hollow-out regions having different shapes are provided in the touch electrode 22a, and a compensation electrode 22b is embedded in each hollow-out region. In the touch structure, the sum of the areas of the five compensation electrodes 22b is equal to the area of the touch electrode 22a. so that the touch electrode 22a and the compensation electrode 22b may be designed to be more balanced, on the one hand, the capacitance brought by the touch structure is not excessively large, and the driving pressure of the driving IC is reduced; on the other hand, the touch structure can be ensured to maintain a certain touch sensitivity.

In fact, in a specific touch structure, in the situation in which the touch sensitivity and the driving capability are permitted, the balance of the design may be considered only on the first touch structure, that is to say, the area orthographically projected on the substrate by the first compensation electrode is equal to the area orthographically projected on the substrate by the first touch electrode. It is also possible to consider the balance of the design only on the second touch structure, that is to say, the area orthographically projected on the substrate by the second compensation electrode is equal to the area orthographically projected on the substrate by the second touch electrode. Preferably, the area orthographically projected on the substrate by the first compensation electrode in the touch structure is equal to the area orthographically projected on the substrate by the first touch electrode, and the area orthographically projected on the substrate by the second compensation electrode is equal to the area orthographically projected on the substrate by the second touch electrode.

In this embodiment, the substrate is a flexible substrate (for example, a transparent plastic substrate), and the touch display panel is a flexible touch display panel. In other embodiments, the substrate may be a hard substrate (e.g., a transparent glass substrate), and the touch display panel is a hard touch display panel.

Optionally, in the disclosure, based on the above embodiments, the position of the touch structure may have the following two structures.

Figure 19A:
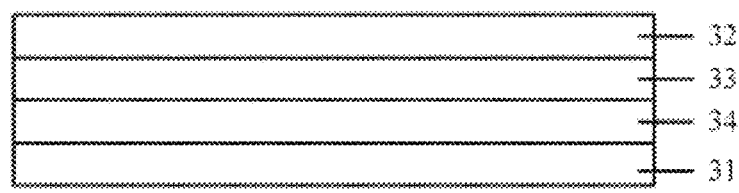
FIG. 19(a) is a third structural schematic cross-sectional view of the touch display panel provided by the disclosure.

Structure a:

With reference to FIG. 19(a), in general, the above touch display panel further comprises a thin film encapsulation layer 33 sandwiched between a display layer 34 and a touch film layer. The thin film encapsulation layer 33 is located between a substrate 31 and a touch structure 32, and the display layer 34 is located between the substrate 31 and the thin film encapsulation layer 33. The thin film encapsulation layer 33 is used to encapsulate and protect light-emitting subpixels in an array manner in the display layer 34. And a protective layer (not shown in FIG. 19(a)) is located above the touch structure 32 and used to encapsulate and protect the touch film layer 32, wherein the protective layer is made of silicon oxide or acrylic material.

Figure 19B:
FIG. 19(b) is a fourth structural schematic cross-sectional view of the touch display panel provided by the disclosure.

Structure b:

In addition, as an optional structure, with reference to FIG. 19(b), the above touch display panel further comprises: the thin film encapsulation layer 33 located on the display layer 34, wherein the touch structure 32 is sandwiched between any two adjacent sub-film layers of the thin film encapsulation layer 33. The thin film encapsulation layer 33 is composed of a plurality of insulative sub-film layers, and the touch structure 32 may be sandwiched between any two insulative sub-film layers of the thin film encapsulation layer 33, so that, on the one hand, the touch structure 32 may be packaged and protected from being damaged or oxidized; on the other hand, the thickness of the touch structure 32 may be used to replace other insulative sub-film layers in the thin film encapsulation layer 33, thereby appropriately reducing the thickness of the thin film encapsulation layer 33 and advantageously achieving the touch panel having a slim and light design. Correspondingly, when the touch structure 32 may be sandwiched between any two insulative sub-film layers of the thin film encapsulation layer 33, no additional protective layer is needed, and the outermost insulative sub-film layer of the thin film encapsulation layer 33 may serve to cover and protect the touch structure 32.

Figure 18:
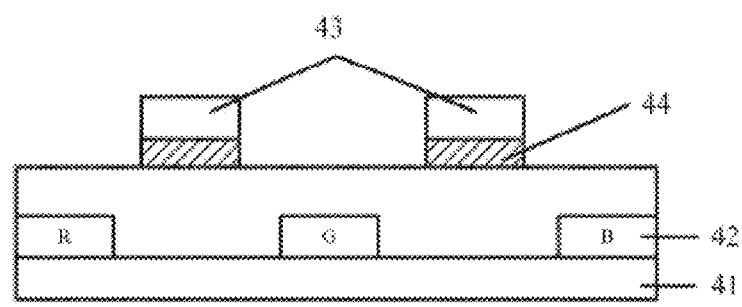
FIG. 18 is a second structural schematic cross-sectional view of the touch display panel provided by the disclosure.

In the disclosure, based on the above embodiment, with reference to FIG. 18, the touch panel mainly comprises from bottom to top a substrate 41, a display film layer 42 on a surface of the substrate 41, and a touch structure 43 on the display film layer 42. The touch structure 43 and the display film layer 42 are insulated from each other. A light-absorbing film layer 44 is provided on a surface of the touch control wiring in the touch structure 43 near the substrate 41.

According to the technical solution, the touch wiring is obstructed by the light-absorbing film layer, and when the display film layer emits light, even if a monochromatic light is emitted to the position at which the touch wiring is located, the light is absorbed by the light-absorbing film layer under the touch wiring without emitting the monochromatic light to adjacent other monochromatic light-emitting areas, thereby avoiding the problem of mixing of pixel color across adjacent pixels and improving the color contrast of the display.

The disclosure further provides a touch display device, including the touch display panel according to any one of the above solutions.

Correspondingly, the disclosure also provides a method of manufacturing a touch display panel. Still with reference to FIG. 2, the method of manufacturing the touch display panel comprises:

providing a substrate 210;
forming an OLED element layer 230 on the substrate 210;
forming a thin film encapsulation layer 220 on the OLED element layer 230; and
forming a touch structure 240 on the thin film encapsulation layer 220;
wherein, the OLED element layer 230 comprises a plurality of light-emitting devices arranged in an array manner, and protections of the touch structure 240 and the light-emitting device of the OLED element layer 230 along the direction from the substrate 210 to the thin film encapsulation layer 220 are not overlapped with each other.

Specifically, a substrate 210 is provided first, and a plurality of thin film transistors (TFTs) are arranged in an array manner on the substrate 210.

Next, an OLED element layer 230 is formed on the substrate 210 and comprises a plurality of light-emitting devices 231 arranged in an array manner. Each light-emitting device 231 comprises a cathode layer, an anode layer, and an organic light-emitting layer disposed between the cathode layer and the anode layer. Wherein the anode layer is connected to the plurality of thin film transistors.

Then, a thin film encapsulation layer 220 is formed on the OLED element layer 230, and the thin film encapsulation layer 220 completely covers the OLED element layer 230.

In this embodiment, the OLED element layer 230 is protected by using the thin film encapsulation layer 220 instead of a packaging substrate. Since the thickness of the thin film encapsulation layer 220 is much smaller than that of the existing packaging substrate, the thickness of the touch display panel 200 can be reduced.

Then, a touch structure 240 is formed on the thin film encapsulation layer 220, and the touch structure 240 is a metal mesh structure. Still with reference to FIG. 3, the touch structure 240 comprises a plurality of first touch electrodes 240a disposed along a first direction and a plurality of second touch electrodes 240b disposed along a second direction, the first touch electrodes 240a and the second touch electrodes 240b are intersected and insulated from each other, and every three adjacent first touch electrodes 240a are connected to form a group of first touch unit, and every three adjacent second touch electrodes 240b are connected to form a group of a second touch unit. There is a one-to-one correspondence between the positions of the first touch unit and the second touch unit.

Wherein, the center-to-center distance L1 between the adjacent first touch units of the same group and the centerto-center distance L2 between the adjacent second touch units of the same group are set according to the precision of the touch, and the edge-to-edge distance D1 between the adjacent first touch units of the same group and the edge-to-edge distance D2 between the adjacent second touch units of the same group are required to meet the design requirements for small spacing and normal spacing.

In this embodiment, in order to meet the touch requirements for passive touch pens of 2 mm and fingers, the center-to-center distance L1 between the adjacent first touch units is equal to the center-to-center distance L2 between the adjacent second touch units and both are between 3 mm and 6 mm. The edge-to-edge distance D1 between the adjacent first touch units is equal to the edge-to-edge distance D2 between the adjacent second touch units and both are between 1 um and 500 um.

Still with reference to FIG. 3, the first touch electrode 240a has a plurality of first electrode elements disposed along the second direction, and the second touch electrodes 240b each has a plurality of second electrode elements disposed along the first direction. In this embodiment, the first direction is a transverse direction, and the second direction is a longitudinal direction. That is to say, the first touch electrode 240a and the second electrode elements of the second touch electrode 240b are transversely disposed, and the second touch electrode 240b and the first electrode elements of the first touch electrode 240a are longitudinally disposed. The size designs for the first touch electrode 240a and the second touch electrode 240b are required to avoid the light-emitting device 231 of the OLED element layer 230 to eliminate moire phenomenon in appearance, and at the same time to meet the requirement for capacitance induction quantity at a node of a mutual capacitance touch screen, achieving the best appearance and touch feel. As shown in FIG. 5, the spacing A between the adjacent first touch electrodes 240a is equal to the spacing B between the adjacent second touch electrodes 240b, and both are between 0.1 mm and 6 mm. The spacing C between the adjacent first electrode elements on the first touch electrode 240a is equal to the spacing D between the adjacent second electrode elements on the second touch electrode 240b, and both are between 0.1 mm and 6 mm. The spacing E between the first electrode elements on the first touch electrode 240a and its adjacent second touch electrode 240b is equal to the spacing F between the second electrode elements on the second touch electrode 240b and its adjacent first touch electrode 240a, and both are between 0.001 mm and 0.1 mm.

Wherein, on the basis that the production yield is ensured, the wire widths of the first touch electrode 240a and the second touch electrode 240b are required to be as small as possible in order to meet the wiring requirements between the pixels. In this embodiment, the wire widths of the first touch electrode 240a and the second touch electrode 240b are equal and between 0.001 mm and 0.020 mm.

With reference to FIG. 2 and FIG. 3 together, when fabricating, the first touch electrode 240a and the second touch electrode 240b are away from the OLED element layer 230, that is to say, the first touch electrodes 240a and the second touch electrodes 240b do not cover the OLED element layer 230. Therefore, the projections of the touch structure 240 and the light-emitting device 231 of the OLED element layer 230 in the direction along the substrate 210 to the thin film encapsulation layer 220 are not overlapped with each other.

Please continue to refer to FIG. 4, the specific process of forming the first touch electrode 240a and the second touch electrode 240b comprises: first, forming a first metal layer (a first touch electrode 240a) on the thin film encapsulation layer 220; then, forming an insulative layer 243 on the first metal layer (the first touch electrode 240a); then forming a second metal layer (a second touch electrode 240b) on the insulative layer 243. Wherein the first metal layer (the first touch electrode 240a), the second metal layer (the second touch electrode 240b), and the insulative layer 243 may be fabricated by using the existing manners such as film forming, exposing, developing, etching, and peeling and so on.

In this embodiment, the plurality of first touch electrodes 240a and the plurality of second touch electrodes 240b are both made of a metal material, and the plurality of first touch electrodes 240a and the plurality of second touch electrodes 240b are staggered to form a metal grid. Since the light-emitting device 231 of the OLED element layer 230 corresponds to the mesh position in the metal grid, light emitted by the light-emitting device 231 may be emitted through the mesh, that is to say, the metal grid does not obstruct the light emitted by the light-emitting device 231.

It should be noted that the shape and size of the above metal grid are merely examples, and are not limited thereto, and a person skilled in the art can set the specific shape and size of the metal grid according to actual needs.

So far, the fabrication of the touch display panel 200 is completed.

The above description is only embodiments of the disclosure and is not intended to limit the disclosure. For a person skilled in the art, the disclosure may have various changes and variations. Any modification, equivalent replacement, and improvement made within the spirit and principle of the disclosure should fall in the scope of the claims of the disclosure.

What is claimed is:

1. A touch display panel, comprising: a substrate, a thin film encapsulation layer, an Organic Light Emitting Diode (OLED) element layer, and a touch structure; the substrate being disposed oppositely to the thin film encapsulation layer, and the OLED element layer being disposed between the substrate and the thin film encapsulation layer, the touch structure being disposed on a side of the thin film encapsulation layer away from the substrate; the OLED element layer comprising a plurality of light-emitting devices arranged in an array manner, and an orthogonal projection of the touch structure along a direction extending from the substrate to the thin film encapsulation layer being not overlapped with an orthogonal projection of the light-emitting device of the OLED element layer along the direction extending from the substrate to the thin film encapsulation layer, wherein, two adjacent light-emitting devices having a gap defined therebetween, a distance between a center of the gap and two outermost sides of the touch structure is not greater than a preset threshold.

2. The touch display panel according to claim 1, wherein, the touch structure comprises: a first touch structure and a second touch structure, wherein the first touch structure and the second touch structure are insulative.

3. The touch display panel according to claim 2, wherein, the first touch structure comprises a plurality of first touch electrodes disposed along a first direction; and the second touch structure comprises a plurality of second touch electrodes disposed along a second direction, and the first touch electrode is disposed crosswise to the second touch electrode.

4. The touch display panel according to claim 3, wherein, the first touch electrode is a first metal layer, the second touch electrode is a second metal layer, and an insulative layer is disposed between the first metal layer and the second metal layer.

5. The touch display panel according to claim 3, wherein, the first touch electrode has a plurality of first electrode elements disposed along the second direction, the second touch electrodes each has a plurality of second electrode elements disposed along the first direction; a distance between the first electrode elements on two adjacent first touch electrodes is equal to a distance between the second electrode elements on two adjacent second touch electrodes; a distance between the first electrode element and the adjacent second touch electrode is equal to a distance between the second electrode element and the adjacent first touch electrode.

6. The touch display panel according to claim 2, wherein, the first touch structure is a first metal grid layer, the second touch structure is a second metal grid layer, and an insulative layer is sandwiched between the first metal grid layer and the second metal grid layer.

7. The touch display panel according to claim 6, wherein, the first metal grid layer is staggered from the second metal grid layer.

8. The touch display panel according to claim 1, wherein, a difference value is obtained by subtracting the preset threshold from a sum of ½ length value of the light-emitting device and the gap spacing value, and a ratio of the difference value to a thickness value of the thin film encapsulation layer is a tangent value of a viewing angle of the touch display panel.

9. The touch display panel according to claim 8, wherein, a film layer thickness value of a touch wiring in the touch structure is negatively correlated with a width value of the touch wiring.

10. The touch display panel according to claim 8, wherein, a wire width of a touch wiring in the touch structure meets the following equation:

$$L \leq 2*l - \alpha = 2*[K/2 - (N*\tan\theta - M)] - \alpha \quad (1)$$

wherein, L represents the wire width of the touch wiring, l represents a ½ wire width of the touch wiring, α represents an engineering capability error, K represents a gap spacing corresponding to the adjacent light-emitting devices, M represents a ½ length of the light-emitting device, N represents a thickness of the thin film encapsulation layer, and θ represents a viewing angle of the touch display panel.

11. The touch display panel according to claim 8, wherein, a wire width of a touch wiring in the touch structure meets the following equation:

$$L = 2^*l - \alpha = 2^*[K/2 - (N^*\tan(90° - \theta1) - M)] - \alpha \quad (2)$$

$$\frac{\sin\theta}{\sin\theta_1} = n \quad (3)$$

wherein, L represents the wire width of the touch wiring, l represents a ½ wire width of the touch wiring, α represents an engineering capability error, K represents a gap spacing corresponding to the adjacent light-emitting devices, M represents a ½ length of the light-emitting device, N represents a thickness of the thin film encapsulation layer, θ represents a viewing angle of the touch display panel, $\theta_1$ represents a refraction angle of the viewing angle after entering the film encapsulation layer, and n represents a refractive index of the film encapsulation layer.

12. The touch display panel according to claim 4, wherein, an electrically conductive material in the touch structure is at least one or more combinations of molybdenum aluminum molybdenum, titanium aluminum titanium, and silver; a material for the insulative layer is at least one or more combinations of silicon oxide, silicon nitride, and silicon oxynitride.

13. A touch display device, comprising a touch display panel including a substrate, a thin film encapsulation layer, an OLED element layer, and a touch structure; the substrate being disposed oppositely to the thin film encapsulation layer, and the OLED element layer being disposed between the substrate and the thin film encapsulation layer, the touch structure being disposed on a side of the thin film encapsulation layer away from the substrate; the OLED element layer comprising a plurality of light-emitting devices arranged in an array manner, and an orthogonal projection of the touch structure along a direction extending from the substrate to the thin film encapsulation layer being not overlapped with an orthogonal projection of the light-emitting device of the OLED element layer along the direction extending from the substrate to the thin film encapsulation layer, wherein, two adjacent light-emitting devices having a gap defined therebetween, a distance between a center of the gap and two outermost sides of the touch structure is not greater than a preset threshold.

14. A method of manufacturing a touch display panel, comprising:
providing a substrate;
forming an OLED element layer on the substrate;
forming a thin film encapsulation layer on the OLED element layer; and
forming a touch structure on the thin film encapsulation layer;
wherein, the OLED element layer comprises a plurality of light-emitting devices arranged in an array manner, and an orthogonal projection of the touch structure along a direction extending from the substrate to the thin film encapsulation layer is not overlapped with an orthogonal projection of the light-emitting device of the OLED element layer along the direction from the substrate to the thin film encapsulation layer,
wherein, two adjacent light-emitting devices having a gap defined therebetween, a distance between a center of the gap and two outermost sides of the touch structure is not greater than a preset threshold.

* * * * *